US006570466B1

United States Patent
Bahl

(10) Patent No.: US 6,570,466 B1
(45) Date of Patent: May 27, 2003

(54) ULTRA BROADBAND TRAVELING WAVE DIVIDER/COMBINER

(75) Inventor: Inder J. Bahl, Roanoke, VA (US)

(73) Assignee: Tyco Electronics Logistics AG, Steinach/SG (CH)

( * ) Notice: Subject to any disclaimer, the term of this patent is extended or adjusted under 35 U.S.C. 154(b) by 0 days.

(21) Appl. No.: 09/653,957

(22) Filed: Sep. 1, 2000

(51) Int. Cl.[7] .................................................. H01P 5/12
(52) U.S. Cl. ........................................ 333/128; 333/127
(58) Field of Search ............................... 333/128, 127, 333/136, 124

(56) References Cited

U.S. PATENT DOCUMENTS

| | | | |
|---|---|---|---|
| 4,240,051 A | * 12/1980 | Haugsjaa et al. | 333/127 |
| 4,788,509 A | * 11/1988 | Bahl et al. | 330/54 |
| 4,832,761 A | 5/1989 | Geissberger et al. | 148/33.3 |
| 4,847,212 A | 7/1989 | Balzan et al. | 437/41 |
| 5,162,756 A | * 11/1992 | Taniguchi et al. | 330/295 |
| 5,467,064 A | * 11/1995 | Gu | 333/128 |
| 5,634,208 A | * 5/1997 | Nishikawa et al. | 455/327 |
| 5,675,300 A | * 10/1997 | Romerein | 333/100 |
| 5,753,968 A | 5/1998 | Bahl et al. | 257/664 |
| 5,805,043 A | 9/1998 | Bahl | 333/200 |
| 5,939,939 A | * 8/1999 | Gaynor et al. | 333/128 |
| 5,965,935 A | 10/1999 | Bahl et al. | 257/664 |
| 5,977,843 A | * 11/1999 | Watanabe | 333/127 |
| 6,005,442 A | * 12/1999 | Maeda et al. | 330/295 |
| 6,005,454 A | 12/1999 | Kim | 333/128 |
| 6,121,854 A | * 9/2000 | Griffith et al. | 333/128 |
| 6,215,377 B1 | * 4/2001 | Douriet | 333/247 |

OTHER PUBLICATIONS

Alain G. Bert, et al., "The Traveling–Wave Divider/Combiner", *IEEE Transactions on Microwave Theory and Techniques*, vol. MTT–28, No. 12, pp 1468–1473, Dec. 1980.
A.G. Bert, et al., "Progress in GaAs FET Power Combining with the Traveling–Wave Combiner Amplifier", *Microwave Journal*, pp 69–73, Jul. 1981.
H.Q. Tserng, et al., "10–30 GHz Monolithic CaAs Traveling–Wave Divider/Combiner", *Electronic Letters*, vol. 21, No.21, pp. 950–951, Oct. 10, 1985.
David Willems, et al., "A Quasi–Microstrip Traveling–Wave Power Divider/Combiner for Use in High–Density Packages", *IEEE Microwave and Guided Wave Letters*, vol. 3, No. 5, pp. 148, 149, May 1993.

* cited by examiner

*Primary Examiner*—Robert Pascal
*Assistant Examiner*—Dean Takaoka
(74) *Attorney, Agent, or Firm*—McDermott, Will & Emery

(57) ABSTRACT

An ultra broadband traveling wave divider/combiner (TWD/C) with a two section power splitter with an isolation resistor connected in series with a capacitor across the outputs of each set of transmission lines in the first and second sections. The TWD/C may be formed on a GaAs substrate in MMIC realization. The transmission lines may be formed using microstrip lines on a dielectric. A capacitor may be used with an input impedance step down unit to increase the bandwidth of the TWD/C.

14 Claims, 6 Drawing Sheets

ULTRA BROADBAND TRAVELING WAVE DIVIDER/COMBINER

FIELD OF THE INVENTION

This invention relates to a low loss ultra broadband traveling wave divider/combiner. More particularly, the present invention relates to forming a low loss ultra broadband traveling wave divider/combiner on an integrated circuit.

BACKGROUND OF THE INVENTION

Traveling wave power dividers/combiners (TWD/Cs) have been used for dividing high frequency input signals (such as RF or microwave signals) into two or more divided signals, where each divided signal is amplified by a separate amplifier, and the amplified divided signals are combined. TWD/Cs are known to divide and combine signals to/from 3 to 6 power amplifiers. TWD/Cs are commonly used because they are compact, have low loss and are viable well into the millimeter wave frequency range.

A typical TWD/C which is used in the microwave band is known as the so-called Wilkinson type power divider/combiner circuit. FIG. 6 illustrates a conventional Wilkinson divider combiner. As shown in FIG. 6, an input 41 is connected to the end of a first transmission line 42 and to the end of a resistor 43. Another input 44 is connected to the end of another transmission line 45 and to the other end of the resistor 43. The other ends of the transmission lines 42 and 45 are connected to each other at a combining node 46, which is connected to output 47. The resistor 43 is an isolation resistor which absorbs a reflective signal between nodes 41 and 44, thus attenuating an unbalance between the nodes 41 and 44. The length of each of the transmission lines 42 and 45 are typically set at about ¼ of the wavelength of the input signal. TWD/Cs are typically designed using a cascade of Wilkinson power dividers, each having a different power division ratio. For example, a 4-way TWD/C may use the power division ratios of 4:1, 3:1 and 2:1. Since most systems require power amplifiers with a high power added efficiency, the combiner must have low loss and be well matched to the designed input and output impedance of the amplifier, which is typically 50 ohms. However, the typical TWD/Cs have a limited active bandwidth.

It is known to improve the isolation characteristics of the transmission lines by placing a capacitor in series with the isolation resistor. This approach is described in U.S. Pat. No. 5,977,843 to Watanabe, entitled "High Frequency Power Divider And High Frequency Power Combiner." Watanabe places the capacitor in series with the resistor to cancel the parasitic inductive properties of the signal line connecting the isolation resistor, which Watanabe describes as parasitic transmission lines. Watanabe discloses that the parasitic inductance causes the isolation characteristics to deteriorate and thus the capacitor prevents the deterioration of the isolation characteristics.

It is also known in the art to produce low loss microstrip lines for monolithic microwave integrated circuits. One approach is described in U.S. Pat. No. 5,753,968 to Bahl et al. entitled "Low Loss Ridged Microstrip Line for Monolithic Microwave Integrated Circuit (MMIC) Applications, herein incorporated by reference. Bahl et al. discloses to form a microstrip line by forming a strip conductor on top of a dielectric which is formed on a substrate. The dielectric preferably has a dielectric constant less than the dielectric constant of the substrate. In this manner, the dielectric reduces the dissipation loss of the microstrip line.

However, the prior art typically only provides a TWD/C which is suitable over a relatively small bandwidth. Accordingly, there is need for a TWD/C which is effective over a large bandwidth. Additionally, there is a need for a TWD/C which provides a broadband multiple division/combination which can be fabricated as an integrated circuit.

SUMMARY OF THE INVENTION

The present invention may comprise an ultra broadband traveling wave divider/combiner comprising; a substrate; at least one divider/combiner unit formed on said substrate, each divider/combiner unit of said at least one divider/combiner unit comprising: a first transmission line which receives a portion of an input; a second transmission line which receives the remaining portion of said input; a first resistor connected in series with a first capacitor across outputs of said first transmission line and said second transmission line; a third transmission line connected to the output of said first transmission line and which receives an input from said first transmission line; a fourth transmission line connected to the output of said second transmission line and which receives an input from said second transmission line; a second resistor connected in series with a second capacitor across outputs of said third transmission line and said fourth transmission line; an output connected to the output of said fourth transmission line.

In a further aspect of the present invention, any of the transmission lines of the present invention may further comprise a dielectric layer formed on said substrate; and a metal layer formed on said dielectric layer, wherein said metal layer is connected to one of said resistor and said capacitor.

In a further aspect of the present invention, the metal layer in the transmission lines of the present invention may overhang said dielectric layer such that a via hole is formed, and the metal layer may connect to the resistor and/or the capacitor through first via hole.

The present invention may comprise an impedance step down unit; a capacitor connected to the impedance step down unit; and a plurality of divider/combiner units cascaded.

In another aspect of the invention the impedance step down unit may comprise a first transmission line and a second transmission line connected to the output of the first transmission line.

In a further aspect of the invention the capacitor may be connected between the output of the first transmission line and ground.

Additional advantages of the present invention will become apparent to those skilled in the art from the following detailed description of exemplary embodiments of the present invention. The invention itself can better be understood by reference to the following detailed description and the accompanying drawings.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings.

In the various figures, identical or similar elements, structures and operations are similarly numbered. Any differences between similarly numbered elements, structures and operations in the various figures will be apparent to the artisan from the figures or from the following description.

DETAILED DESCRIPTION OF THE INVENTION

Reference will now be made in detail to the presently preferred embodiments of the invention, examples of which are illustrated in the accompanying drawings.

Figure 1A:
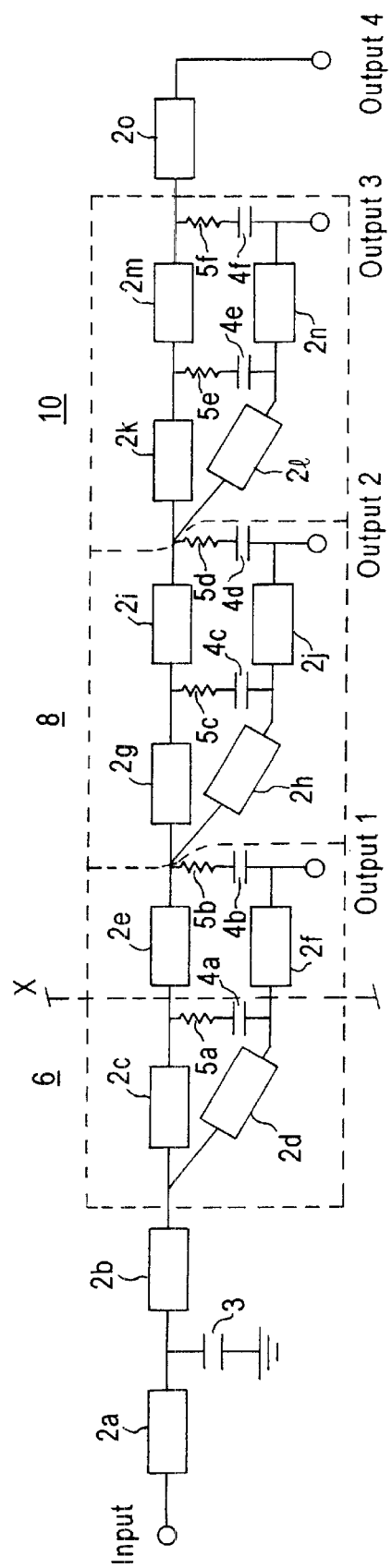
FIG. 1(a) illustrates a schematic of a TWD/C according to the present invention.

FIG. 1(a) illustrates a schematic of a broadband 4-way TWD/C 12 produced according to the present invention. In FIG. 1(a), a transmission line 2a receives an input and may provide the input to the transmission line 2b. A capacitor 3 is preferably connected between the transmission line 2a and ground. The transmission line 2b may provide the input signal to a first two section Wilkinson type divider/combiner circuit 6.

In the first section of the divider/combiner the input signal may be divided between a first signal line containing transmission lines 2c and 2e and second signal line containing transmission lines 2d and 2f. The input signal is divided between the first signal line (transmission lines 2c and 2e) and the second signal line (transmission lines 2d and 2f). Preferably, the relative impedances of the first signal line (transmission line 2c in conjunction with transmission line 2e) and the second signal line (transmission line 2d in conjunction with transmission line 2f) is such that three fourths of the input signal passes on the first signal line and one fourth passes on the second signal line. The output of the second signal line is provided as Output 1, which is preferably one fourth of the input signal. The output of the first signal line is provided as the input signal to a second two section Wilkinson type divider/combiner circuit 8.

An isolation resistor 5a may be connected in series with an isolation capacitor 4a between the Outputs of the transmission lines 2c and 2d and the inputs of the transmission lines 2e and 2f respectively, as shown in FIG. 1(a). Another isolation resistor 5b may be connected in series with another isolation capacitor 4b between the outputs of the transmission lines 2f and 2e, as also shown in FIG. 1(a). The capacitors 4a and 4b may serve to reduce a parasitic inductance caused by the high frequency signal traveling over the signal lines containing the isolation resistors 5a and 5b, respectively.

As shown in FIG. 1(a) a second two section Wilkinson type divider/combiner 8 may be cascaded with the first divider/combiner 6 such that it receives an input from the first divider/combiner 6. In the second divider/combiner 8 the divided input signal may be divided again between a third signal line containing transmission lines 2g and 2i and fourth signal line containing transmission lines 2h and 2j. The input signal is divided between the third signal line (transmission lines 2g and 2i) and the fourth signal line (transmission lines 2h and 2j). Preferably, the relative impedances of the third signal line (transmission line 2g in conjunction with transmission line 2i) and the fourth signal line (transmission line 2h in conjunction with transmission line 2j) is such that one half of the original input signal (input into divider/combiner 6) passes on the third signal line and one fourth passes on the fourth signal line. The output of the fourth signal line is provided as Output 2, which is preferably one fourth of the input signal. The output of the third signal line is provided as the input signal to a third two section Wilkinson type divider/combiner circuit 10.

The second combiner/divider 8 also preferably contains a resistor 5c connected in series with a capacitor 4c between the output of the transmission lines 2g and 2h and the output of the transmission lines 2i and 2j. A resistor 5d may also be connected in series with a capacitor 4c between the output of the transmission lines 2i and 2j.

A third two section Wilkinson type divider/combiner 10 may be cascaded with the second divider/combiner 8 such that it receives an input from the second divider/combiner 8, as shown in FIG. 1(a). The structure and operation of the third divider/combiner 10 are similar to that of the first divider/combiner 6 and second divider/combiner 8. Particularly, as shown in FIG. 1(a), the third divider/combiner preferably contains transmission lines 2k, 2l and 2m, 2n arranged in first and second sections respectively, and a resistor 5e arranged in series with a capacitor 4e between the first and second portions, and a resistor 5f arranged in series with a capacitor 4f between the output of the transmission lines 2m and 2n located in the second section. Preferably, the relative impedances of a fifth signal line (transmission line 2k in conjunction with transmission line 2m) and a sixth signal line (transmission line 2l in conjunction with transmission line 2n) is such that one fourth of the original input signal (input into divider/combiner 6) passes on the fifth signal line and one fourth passes on the sixth signal line. The output of the sixth signal line is provided as Output 3, which is preferably one fourth of the input signal. The output of the sixth signal line is provided as the input signal to a transmission line 2o. The transmission line 2o may provide a fourth output, labeled as Output 4 in FIG. 1(a), and thus provide the remaining portion of the original input signal, which is one fourth of the input signal.

The transmission lines 2a–2o may all have the same length or may have different lengths. Those of skill in the art will appreciate that the length of the transmission lines are typically related to a fraction of the wavelength of the intended input signal to be divided by the divider/combiner, and thus the length of the transmission lines 2a–2o may be any fraction of the wave length which reduces internal reflection.

Figure 1B:
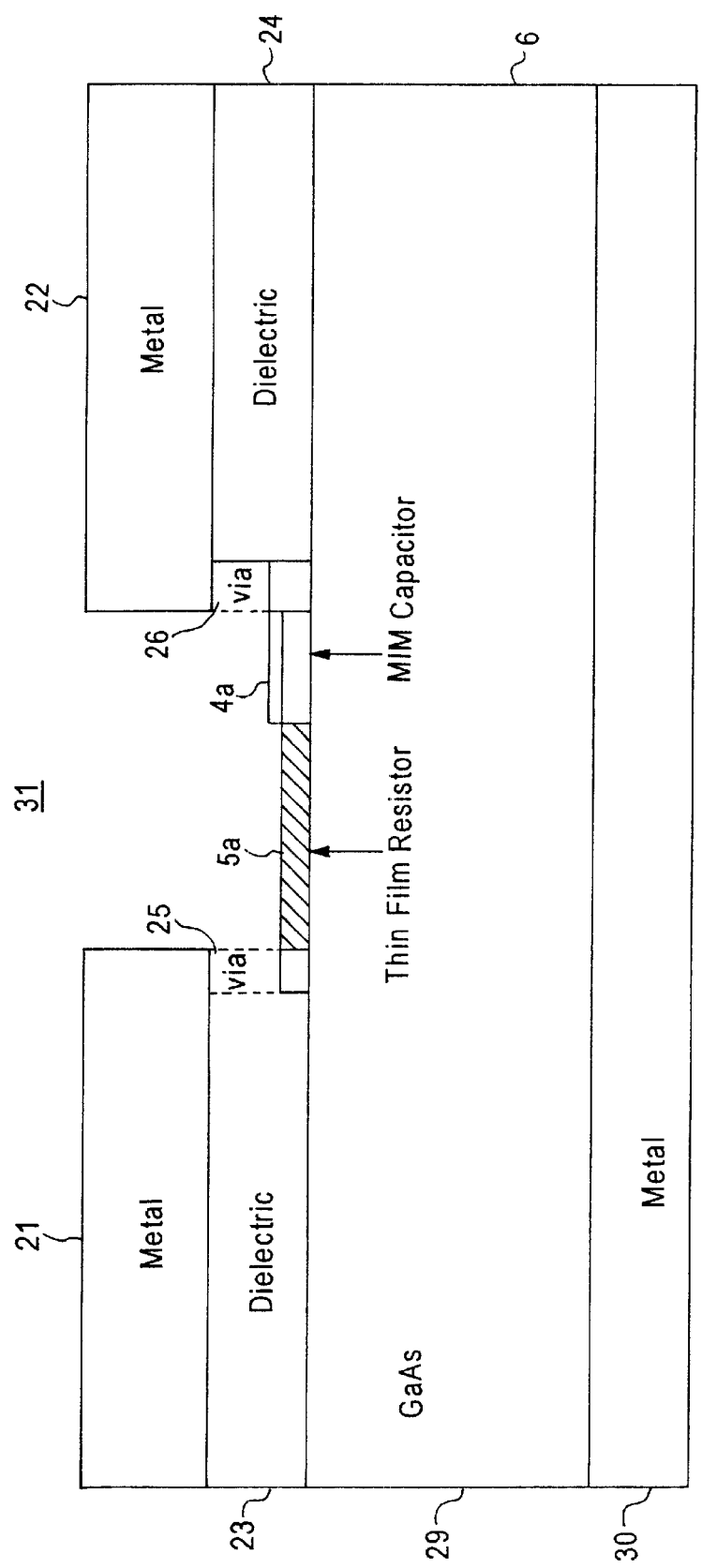
FIG. 1(b) illustrates a cross section of the TWD/C of the present invention.

In the preferred embodiment of the present invention, the TWD/C 12 shown in FIG. 1(a) may be formed in a monolithic microwave integrated circuit (MMIC). That is, the transmission lines are preferably formed as microstrip lines. A cross section of the first divider/combiner 6 with MMIC realization, along dotted line X in FIG. 1(a) is shown in FIG. 1(b). Preferably, the MMIC realization of the TWD/C 12 is achieved by the techniques disclosed in U.S. Pat. No. 5,753,968 to Bahl et al. previously incorporated by reference.

shown in FIG. 1(b), metal layers 21 and 22 may be formed on dielectric layers 23 and 24 respectively. The metal layer 21 in conjunction with the dielectric layer 23 forms a microstrip line which may be used as transmission line 2c, and the metal layer 22 in conjunction with the dielectric layer 24 forms another microstrip line which may be used as transmission line 2d. The dielectric layers 23 and 24 may be formed on a semiconductor substrate 29, preferably a gallium arsenide substrate (GaAs), which preferably has a thickness of about 3 mil. Bonding pads and via holes may be formed onto or into the GaAs substrate in the case of MMIC realization using techniques known to those of skill in the art.

The resistor 5a also may be formed on the substrate 29 in series with the capacitor 4a which also may be formed on the substrate 29. The resistor 5a and the capacitor 4a may be formed in a gap 31 between the dielectric layer 23 and the dielectric layer 24, as shown in FIG. 1(b). The metal layer 21 preferably overhangs the dielectric layer 23 so that a via hole 25 may be formed through which the metal layer 21 may be connected to the resistor 5a. Similarly, the metal layer 22 preferably overhangs the dielectric layer 23 so that a via hole 26 may be formed through which the metal layer 22 may be connected to the capacitor 4a. In this manner, the resistor 5a and the capacitor 4a may be connected in series between metal layer 21 and metal layer 22. As also shown in FIG. 1(b), a metal layer 30 may be formed on the opposite side of the substrate 29 from the side on which the metal layers 21 and 22 are formed. The metal layer 30 serves as a ground plane as is known in the art.

The TWD/C of the present invention may be fabricated using several available technologies, including conventional microwave integrated circuit, low temperature cofired ceramic, and monolithic microwave integrated circuit (MMIC) fabrication techniques. The multilayer GaAs MMIC process may include a half-layer of interconnect consisting of gold deposited by e-beam evaporation and a layer of thicker plated gold metallization.

Preferably, the metal layers 21 and 22 are formed as strip conductors as described in U.S. Pat. No. 5,753,968. The metal layers are preferably thick metal layers and have a thickness of about 9 $\mu$m, whereas the prior art typically has a thickness of only 3–5 $\mu$m. The metal layers 21 and 22 are also preferably plated in gold. The thick gold plated metal layers reduces the dissipative loss through the transmission lines. The dissipative loss is typically caused by attenuation of the input signal due to resistive properties of the component of the TWD/C.

Also preferably, the dielectric layers 23 and 24 in FIG. 1(b) have a permittivity less than that of the material utilized as the substrate 29, which, as described in U.S. Pat. No. 5,753,968, substantially reduces the dissipative loss of the metal layers 21 and 22 respectively. For example, polyimide material or BCB (benzo-cyclo butene) may be used as the dielectric, although any material which has a dielectric constant less than the substrate 29 may be used. The polyimide may also be as a glassivation layer for mechanical protection of the finished circuitry. The resistor 5a is preferably a thin film resistor, although it may be any type of resistor which is suitable for formation in MMIC realization. The capacitor 4a is preferably a metal-insulated-metal (MIM) capacitor, although it may be any type of capacitor which is suitable for formation in MMIC realization. Both the resistors and the capacitors are preferably formed on/into the GaAs.

Although FIG. 1(b) illustrates only the first section of the first divider/combiner 6, the second section of the first divider/combiner 6 and both sections of the second and third divider/combiners 8 and 10 have substantially the same structure. Accordingly, those of skill in the art will appreciate that the structure shown in FIG. 1(b) also illustrates the structure of those sections.

Since the impedance of most devices which connect to typical TWD/Cs is 50 ohms, the input impedance of a typical TWD/C is made to be 50 ohms. However, as additional divider/combiners are cascaded (i.e. as the number of divisions increase), the impedance of the TWD/C sections increase. However, it is difficult to realize high impedance microstrip sections in MMIC. Thus, to reduce the dissipative loss throughout the TWD/C the input impedance of the TWD/C at location A–A' (see FIG. 1(a)) should be lowered. In the present invention, transmission lines 2a and 2b serve to lower the input impedance of the TWD/C. Additionally, in the present invention, as shown in FIG. 1(a), capacitor 3 serves to widen the bandwidth of the TWD/C. By lowering the impedance using transmission lines 2a and 2b and capacitor 3, the TWD/C can more easily be realized in MMIC.

The topology described for the present invention and shown in FIGS. 1(a) and 1(b) provides a useful TWD/C over a much larger bandwidth (greater than 2 octaves) than typically achieved in the prior art, which is generally limited to a narrow bandwidth. More particularly, the topology of the present invention provides improved performance in terms of insertion loss which measures the loss of the input signal due to attenuation in the TWD/C and also due to reflection, isolation which measures the isolation between the output ports, and VSWR which measures the voltage standing wave ratio of the input and output signals.

Figure 2:
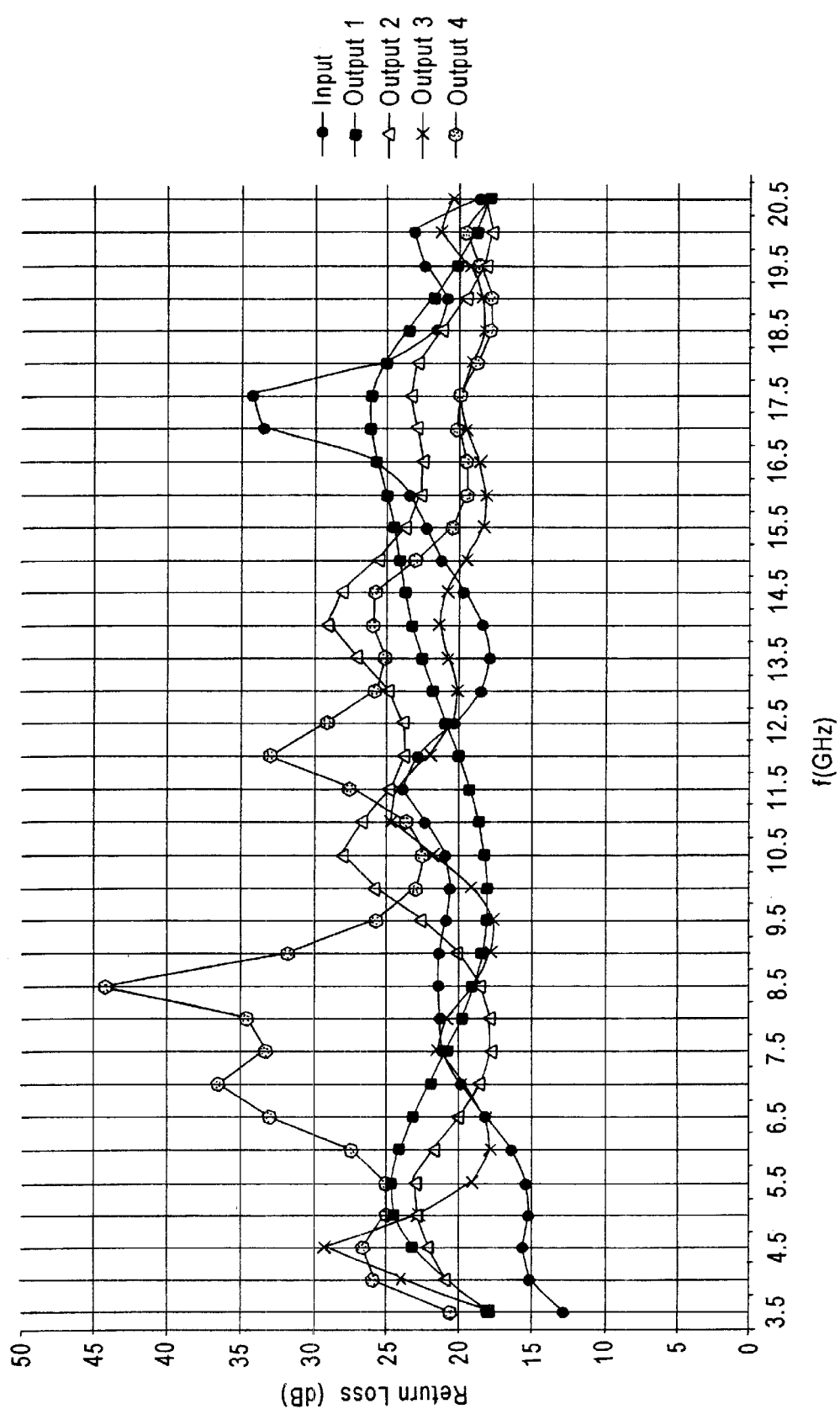
FIG. 2 illustrates a simulated return loss of a 4-way TWD/C made according to the present invention.

FIG. 2 illustrates the results of a simulated return loss of the TWD/C shown in FIGS. 1(a) and 1(b) of the present invention. The return loss measures the magnitude of reflection of the input signal. Those of skill in the art appreciate that a 0 dB return means that substantially all of the signal is reflected, and that 20 dB return indicates that very little of the input signal is reflected. In FIG. 2, a curve marked by diamonds represent the input to the TWD/C. A curve representing the Output 1 of the TWD/C is marked solid squares, a curve representing Output 2 is marked by hollow triangles, a curve representing Output 3 in marked by "X"s, and a curve representing Output 4 is marked by "*"s. As shown in FIG. 2, the TWD/C of the present invention provides a return loss generally better than 15 dB for all of the outputs in a frequency range of 3.5 to 20.5 GHz. Accordingly, as shown in FIG. 2, the TWD/C of the present invention has a generally low reflection loss over a broadband spectrum.

Figure 3:
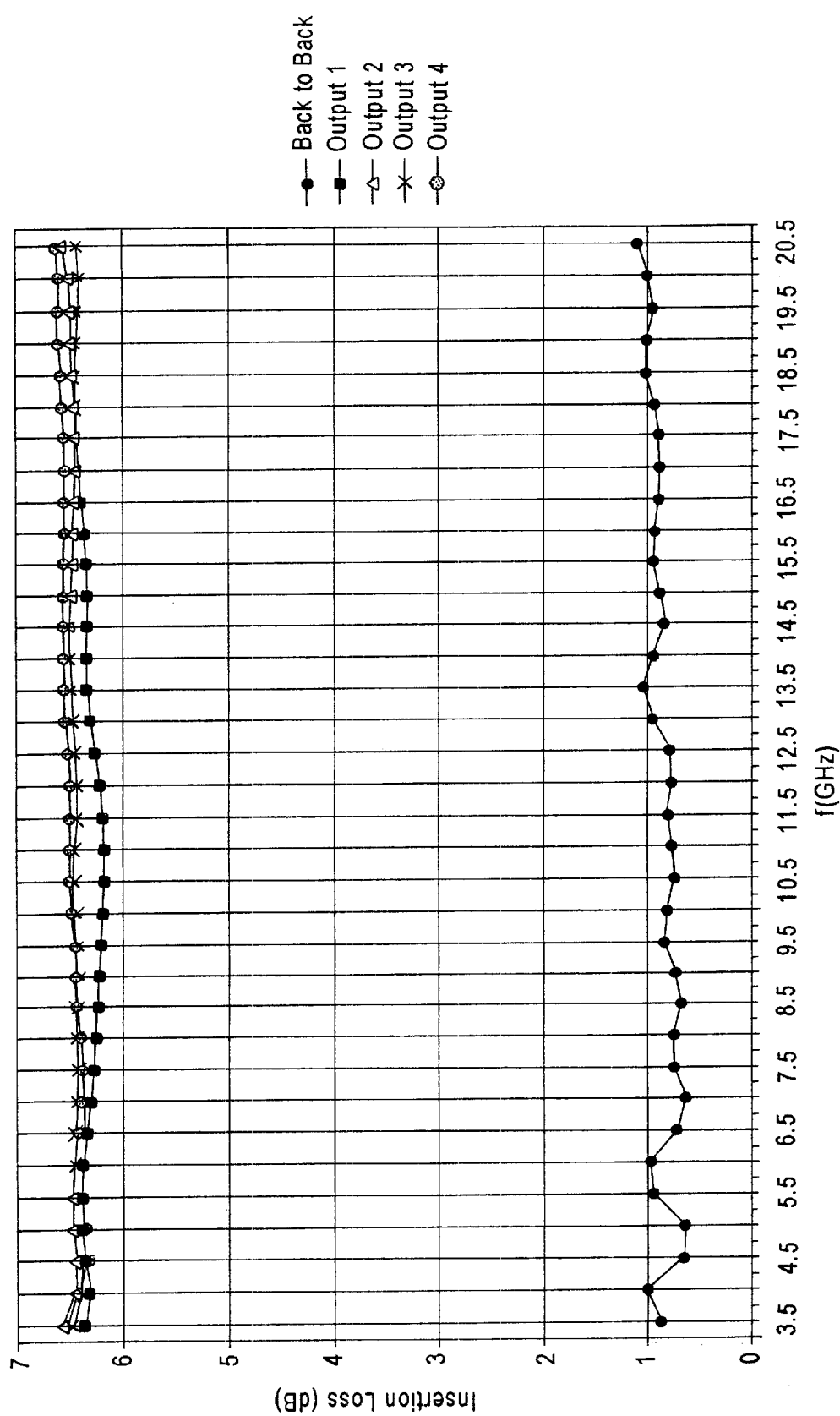
FIG. 3 illustrates a simulated insertion loss of a 4-way TWD/C made according to the present invention.

FIG. 3 illustrates the results of a simulated insertion loss of the TWD/C shown in FIGS. 1(a) and 1(b) of the present invention. Those of skill in the art will appreciate that since the present embodiment of the invention is a divide by 4 TWD/C, the ideal insertion loss value is 6 dB, however, the insertion loss is likely to increase from the ideal value due to attenuation in the conductors and dielectrics in the TWD/C. A curve representing the Output 1 of the TWD/C is marked by solid squares, a curve representing Output 2 is marked by hollow triangles, a curve representing Output 3 in marked by "X"s, and a curve representing Output 4 is marked by "*"s.

As shown in FIG. 3, the TWD/C of the present invention provides an insertion loss between 6.25 and 6.5 dB for all of the outputs in a frequency range of 3.5 to 20.5 GHz. FIG. 3, also shows a simulation of the insertion loss when two TWD/Cs are connected back to back by a curve marked by diamonds. As shown in FIG. 3, the insertion loss is generally less than 1.0 dB when TWD/C's are connected back to back.

Accordingly, as shown in FIG. 3, the TWD/C of the present invention has a low insertion loss over a broadband spectrum. In the typical prior art using a 3 mil GaAs substrate, which is frequently used for power amplifiers, the insertion loss is generally much higher.

Figure 4:
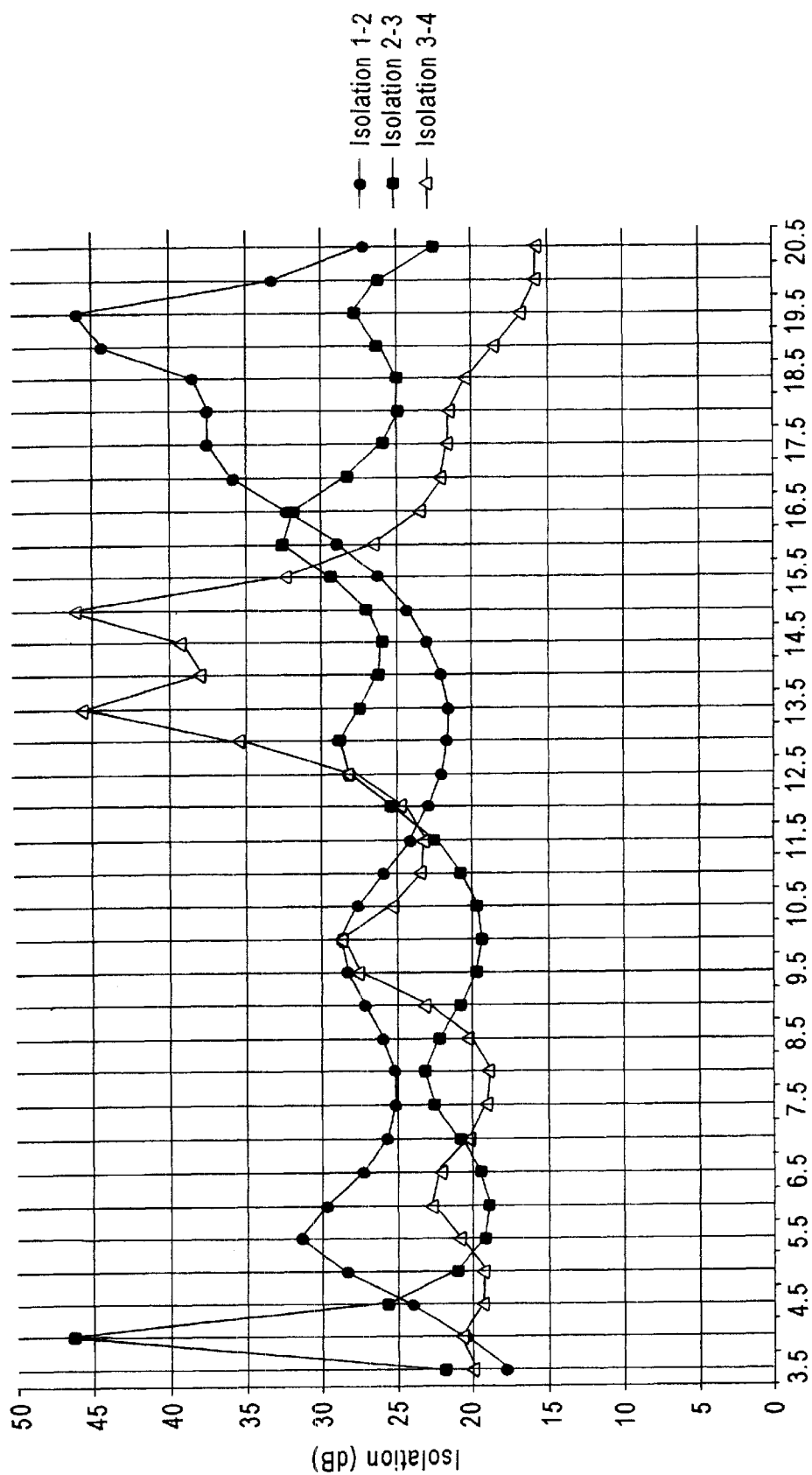
FIG. 4 illustrates a simulated isolation of a 4-way TWD/C made according to the present invention.
Figure 6:
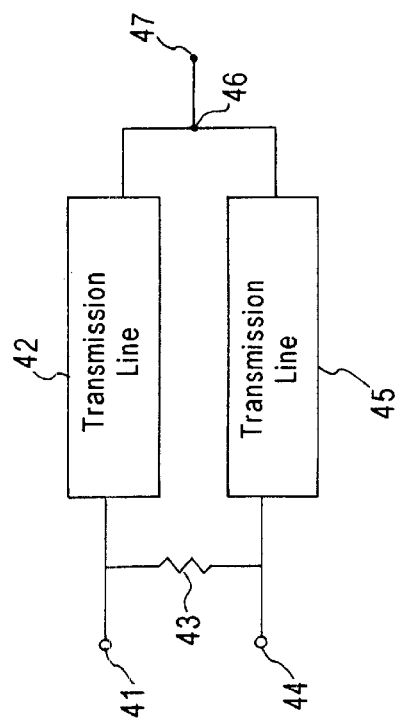
FIG. 6 illustrates a typical prior art Wilkinson type TWD/C.

FIG. 4 illustrates the results of a simulated isolation of the TWD/C shown in FIGS. 1(a) and 1(b) of the present invention. Those of skill in the art will appreciate that an isolation of 20 dB is excellent, however an isolation of 18–20 dB is generally acceptable. In FIG. 4, a curve marked by diamonds represents the isolation between the Output 1 port and the Output 2 port, a curve marked by solid squares represents the isolation between the Output 3 port and the Output 3 port, and a curve marked by hollow triangles represents the isolation between the Output 3 port and the Output 4 port. As shown in FIG. 4, the TWD/C of the present invention provides an isolation better than 19 dB over a frequency range of 4.0 to 20.5 GHz.

Figure 5:
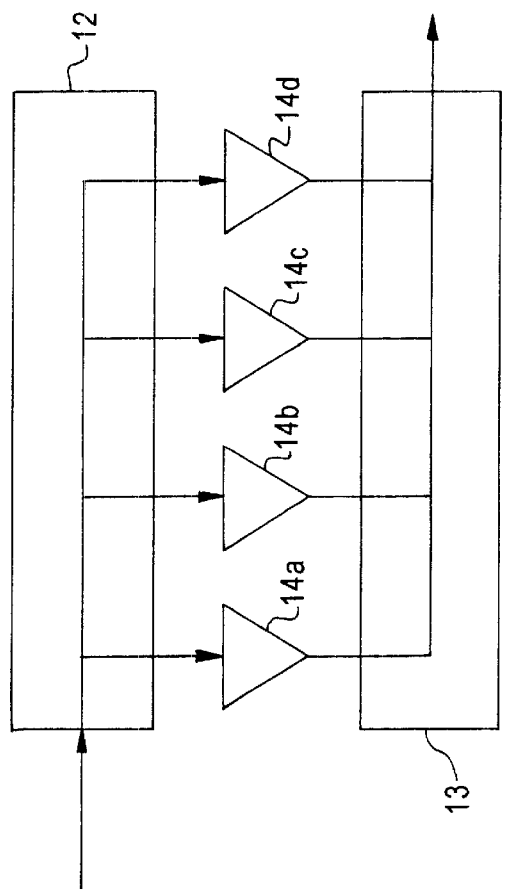
FIG. 5 illustrates a 4-way power divider in use with a 4-way power combiner according to the present invention.

FIG. 5 illustrates using the TWD/C of the present invention. As shown in FIG. 5, the TWD/C 12 is used as a divider such that the input signal is equally divided between four outputs (Output 1, Output 2, Output 3, and Output 4). The signal provided by each of the outputs is preferably amplified by amplifiers 14a, 14b, 14c, and 14d respectively. Each of the amplifiers preferably have the amplification ratio. The amplified signals are then provided to a TWD/C 13 which is used as a combiner such that the four amplified signals are combined into one signal and provided as the output. The TWD/C 13 has preferably the same structure as the TWD/C 12, except the direction of the signal flow is reversed such that the TWD/C 13 combines the signals instead of dividing the signals.

Those of skill in the art will appreciate that present invention achieves suitable performance over a larger bandwidth than a typical TWD/C in the art, which is generally limited to a small bandwidth. The present invention enables development of MMIC based ultra broadband power amplifiers with high efficiencies since the losses are low and the structure is well matched at all ports.

In a multi-layer microstrip fabrication embodiment, two dielectric layers (such as polyimide) may be used as described in U.S. Pat. No. 5,753,968 to Bahl et al., herein incorporated by reference. Preferably, as a first dielectric layer is formed on the substrate, which is preferably GaAs, and a first metal layer is formed on the first dielectric layer. Next, as a second dielectric layer is formed on the first metal layer and a second metal layer is formed on the second dielectric layer. The first dielectric layer serves as a buffer and is preferably made of polyimide and preferably has a thickness of about 7 $\mu$m. The second dielectric layer serves to reduce the low capacitance crossover between the metal layers and is also preferably made of polyimide and preferably has a thickness of about 3 $\mu$m. Also in the multi-layer microstrip fabrication process, one or more additional layers of the polyimide films may be applied between the metallization layers in order to achieve a polyimide thickness up to 10 $\mu$m underneath the plated gold metalization layer. The polyimide may be used not only as an interlevel dielectric for the interconnect metal (metal layer 21/21), but may also be as a glassivation layer for mechanical protection of the finished circuitry.

When polyimide is used as the dielectric, the polyimide layers may be fabricated using automated coating and curing equipment as known to those of skill in the art. Patterning may also be accomplished using automated coating and curing equipment as known to those of skill in the art. Patterning may be accomplished using thick photoresist masks and reactive ion etching in oxygen.

Although the present invention has been fully described by way of examples with reference to the accompanying drawings, it is to be noted that various changes and modifications will be apparent to those skilled in the art. For example, the technique disclosed in the present invention may be applied to TWD/C's of any power division, including a 3-way, 5-way, and a 6 way TWD/C. The structure disclosed in the present invention may be constructed using MMIC or multilayer MMIC or MIC technology. Additionally, coplanar waveguides (CPW) can also be used in lieu of microstrip lines as the transmission lines. Therefore, unless such changes and/or modifications depart from the scope of the present invention as defined by the appended claims, they should be construed as being included therein.

What is claimed is:

1. An ultra broadband traveling wave divider/combiner comprising:
   a substrate;
   at least one divider/combiner unit formed on said substrate, each divider/combiner unit of said at least one divider/combiner unit comprising:
   a first transmission line which receives a portion of an input signal;
   a second transmission line which receives the remaining portion of said input signal;
   a first resistor connected in series with a first capacitor across outputs of said first transmission line and said second transmission line;
   a third transmission line connected to the output of said first transmission line and which receives an input from said first transmission line;
   a fourth transmission line connected to the output of said second transmission line and which receives an input from said second transmission line;
   a second resistor connected in series with a second capacitor across outputs of said third transmission line and said fourth transmission line;
   an output connected to the output of said fourth transmission line.

2. The ultra broadband traveling wave divider/combiner of claim 1, wherein said first transmission line further comprises:
   a first dielectric layer formed on said substrate; and
   a first metal layer formed on said dielectric layer, wherein said first metal layer is connected to one of said first resistor and said first capacitor.

3. The ultra broadband traveling wave divider/combiner of claim 2, wherein said first metal layer is wider than said first dielectric layer such that said first metal layer overhangs said first dielectric layer and a first via hole is formed, and said first metal layer connects to said first resistor or said first capacitor through said first via hole.

4. The ultra broadband traveling wave divider/combiner of claim 2, wherein said second transmission line further comprises:
   a second dielectric layer formed on said substrate;
   a second metal layer formed on said dielectric layer, wherein
   said second metal layer is connected to the other one of said first resistor and said first capacitor.

5. The ultra broadband traveling wave divider/combiner of claim 4, wherein said second metal layer is wider than said second dielectric layer such that said second metal layer overhangs said second dielectric layer and a second via hole is formed, and said second metal layer connects to said first resistor or said first capacitor through said second via hole.

6. The ultra broadband traveling wave divider/combiner of claim 4, wherein said third transmission line further comprises:
   a third dielectric layer formed on said substrate; and
   a third metal layer formed on said dielectric layer, wherein said third metal layer is connected to one of said second resistor and said second capacitor.

7. The ultra broadband traveling wave divider/combiner of claim 6, wherein said third metal layer is wider than said third dielectric layer such that said third metal layer overhangs said third dielectric layer and a third via hole is formed, and said third metal layer connects to said second resistor or said second capacitor through said third via hole.

8. The ultra broadband traveling wave divider/combiner of claim 6, wherein said fourth transmission line further comprises:
   a fourth dielectric layer formed on said substrate; and
   a fourth metal layer formed on said dielectric layer, wherein
      said fourth metal layer is connected to the other one of said second resistor and said second capacitor.

9. The ultra broadband traveling wave divider/combiner of claim 8, wherein said fourth metal layer is wider than said fourth dielectric layer such that said fourth metal layer overhangs said fourth dielectric layer and a fourth via hole is formed, and said fourth metal layer connects to said second resistor or second capacitor through said fourth via hole.

10. The ultra broadband traveling wave divider/combiner of claim 1, wherein said substrate is formed of GaAs.

11. The ultra broadband traveling wave divider/combiner of claim 1, wherein at least one of said first resistor and said second resistor is a thin film resistor.

12. The ultra broadband traveling wave divider/combiner of claim 1, wherein at least one of said first capacitor and said second capacitor is a MIM capacitor.

13. The ultra broadband traveling wave divider/combiner of claim 1, further comprising two divider/combiner units, said two divider/combiner units being cascaded.

14. The ultra broadband traveling wave divider/combiner of claim 1, further comprising up to three divider/combiner units, each divider combiner unit being cascaded.

* * * * *